United States Patent [19]
Shimada

[11] Patent Number: 5,585,195
[45] Date of Patent: Dec. 17, 1996

[54] METAL INSERT AND ROUGH-SURFACE TREATMENT METHOD THEREOF

[75] Inventor: Toshihiko Shimada, Nagano, Japan

[73] Assignee: Shinko Electric Industries Company, Limited, Nagano, Japan

[21] Appl. No.: 89,550

[22] Filed: Jul. 12, 1993

[30] Foreign Application Priority Data

Jul. 11, 1992 [JP] Japan ................................ 4-207480

[51] Int. Cl.$^6$ ................................ B22F 5/00; B05D 5/12
[52] U.S. Cl. ............................ 428/548; 428/546; 427/98
[58] Field of Search ................................ 428/546, 548; 361/421; 257/676; 427/98

[56] References Cited

U.S. PATENT DOCUMENTS

| | | | |
|---|---|---|---|
| 4,529,667 | 7/1985 | Shiga et al. | 428/646 |
| 4,707,724 | 11/1987 | Suzuki et al. | 357/71 |
| 4,894,752 | 1/1990 | Murata et al. | 361/421 |
| 5,221,859 | 6/1993 | Kobayashi et al. | 257/676 |

FOREIGN PATENT DOCUMENTS

| | | |
|---|---|---|
| 57-030355 | 2/1982 | Japan . |
| 59-136957 | 8/1984 | Japan . |
| 63-160367 | 11/1988 | Japan . |
| 63-249361 | 2/1989 | Japan . |
| 01-065898 | 3/1989 | Japan . |
| 02129325 | 8/1990 | Japan . |
| 02-209759 | 8/1990 | Japan . |
| 02-308555 | 12/1990 | Japan . |

OTHER PUBLICATIONS

*Patent Abstract of Japan*, vol. 6, No. 95 (E–110) 3 Jun. 1982 & JP–A–57 030 355 (Tanaka Denshi Kogyo KK) 18 Feb. 1982.
*Patent Abstracts of Japan*, vol. 8, No. 264 (E–282) 4 Dec. 1984 & JP–A–59 136 957 (Suwa Seikosha KK) 6 Aug. 1984.
*Patent Abstracts of Japan*, vol. 13, No. 280 (E–779) 27 Jun. 1989 & JP–A–01 065 898 (Fujitsu Ltd) 13 Mar. 1989.
*Patent Abstracts of Japan*, vol. 14, No. 507 (E–998) 6 Nov. 1990 & JP–A–02 209 759 (Shinko Electric Ind Co Ltd) 21 Aug. 1990.
*Patent Abstracts of Japan*, vol. 15, No, 98 (E–1042) 8 Mar. 1991 & JP–A–02 308 555 (Toshiba Corp) 21 Dec. 1990.

Primary Examiner—Donald P. Walsh
Assistant Examiner—John N. Greaves
Attorney, Agent, or Firm—Staas & Halsey

[57] ABSTRACT

A metal insert at least partially embedded in a molded resin mass comprises a metal insert blank, and a substantial amount of nickel or nickel alloy granulations produced over a surface of the metal insert blank, and the size of the granulations is at most 1.0 μm. The metal insert blank is treated by a first electrolytic plating process such that a substantial quantity of copper nuclei spreaded over the surface, and the copper nuclei are grown up as the nickel or nickel alloy granulations by a second electrolytic-plating process. The first electrolytic-plating process is controlled such that an average thickness of plating is from about 0.5 to about 1.0 μm, and the second electrolytic-plating process is controlled such that an average thickness of plating is from about 0.5 to about 1.5 μm.

12 Claims, 3 Drawing Sheets

METAL INSERT AND ROUGH-SURFACE TREATMENT METHOD THEREOF

BACKGROUND OF THE INVENTION

1) Field of the Invention

The present invention relates to a metal insert which is at least partially embedded in a molded resin mass, and also relates to a method of surface treatment for toughening surfaces of such a metal insert.

2) Description of the Related Art

For example, as a metal insert which is partially embedded in a molded resin mass, a lead frame is well known to be used in the production of electronic components or electronic packages. In general, the lead frame comprises a central stage for supporting an electric element such as an integrated circuit (IC) chip, and a plurality of lead elements arranged around the central stage. In the production of electronic package, the IC chip is securely mounted on the central stage of the lead frame, and then is electrically connected to the inner ends of the lead elements by a well-known wire-bonding process. Thereafter, the central stage with the IC chip is enclosed together with the inner ends of the lead elements by a split mold, and then a suitable curable synthetic resin is introduced into the split mold. Thus, the IC chip is sealed in the molded resin mass in such a manner that the lead frame is partially embedded therein.

The lead frame may be formed from a thin Cu plate, Cu alloy plate, Ni-Fe alloy plate or the like by a mechanical punching process or a photoetching process, and is subjected to a surface treatment so as to improve an adhesion property with respect to the molded resin mass. For example, the surfaces of the lead frame are roughened by a mechanical pressing process or a chemical etching process, and thus the contact area between the lead frame and the molded resin mass is increased so that the lead frame exhibits an improved adhesion property to the molded resin mass. If the lead frame is not subjected to the rough-surface treatment, moisture can easily penetrate into the boundaries between the lead frame and the molded resin mass, so that cracks may occur in the molded resin mass due to evaporation of the penetrated moisture.

Nevertheless, when the lead frame is subjected to the rough-surface treatment by the mechanical pressing process, a residual strain is produced in the pressed lead frame, and is actualized as a warp in the lead frame under the thermal influence derived from the molding process. Also, in the chemical etching process for the rough-surface treatment, it is very difficult and troublesome to control a degree of roughness without reducing the strength of the lead frame.

SUMMARY OF THE INVENTION

Accordingly, an object of the present invention is to provide a metal insert which is at least partially embedded in a molded resin mass, and which exhibits an improved adhesion property to the molded resin mass.

Another object of the present invention is provide a novel rough-surface treatment method for obtaining the metal insert as mentioned above.

In accordance with the present invention, there is provided a metal insert at least partially embedded in a molded resin mass, comprising: a metal insert blank; and a substantial amount of nickel or nickel alloy granulations provided over a surface of the metal insert blank, the size of the granulations being at most 1.0 μm. The metal insert blank is treated by a first electrolytic-plating process such that a substantial quantity of copper nuclei spread over the surface, and the copper nuclei are grown as the nickel or nickel alloy granulations by a second electrolytic-plating process. The first electrolytic-plating process is controlled such that an average thickness of plating is from about 0.5 to about 1.0 μm, and the second electrolytic-plating process is controlled such that an average thickness of plating is from about 0.5 to about 1.5 μm. Preferably, the metal insert blank is formed from a metal material selected from the group consisting of copper, copper alloy, and Fe-Ni alloy. When the granulations are grown up with the nickel alloy, the second electrolytic-plating process may be selected from the group consisting of a Sn-Ni alloy plating process, a Co-Ni alloy plating process, and a Fe-Co-Ni alloy plating process.

BRIEF DESCRIPTION OF THE DRAWINGS

The other objects and advantages of the present invention will be better understood from the following description, with reference to the accompanying drawings, in which.

DESCRIPTION OF THE PREFERRED EMBODIMENTS

Figure 1:
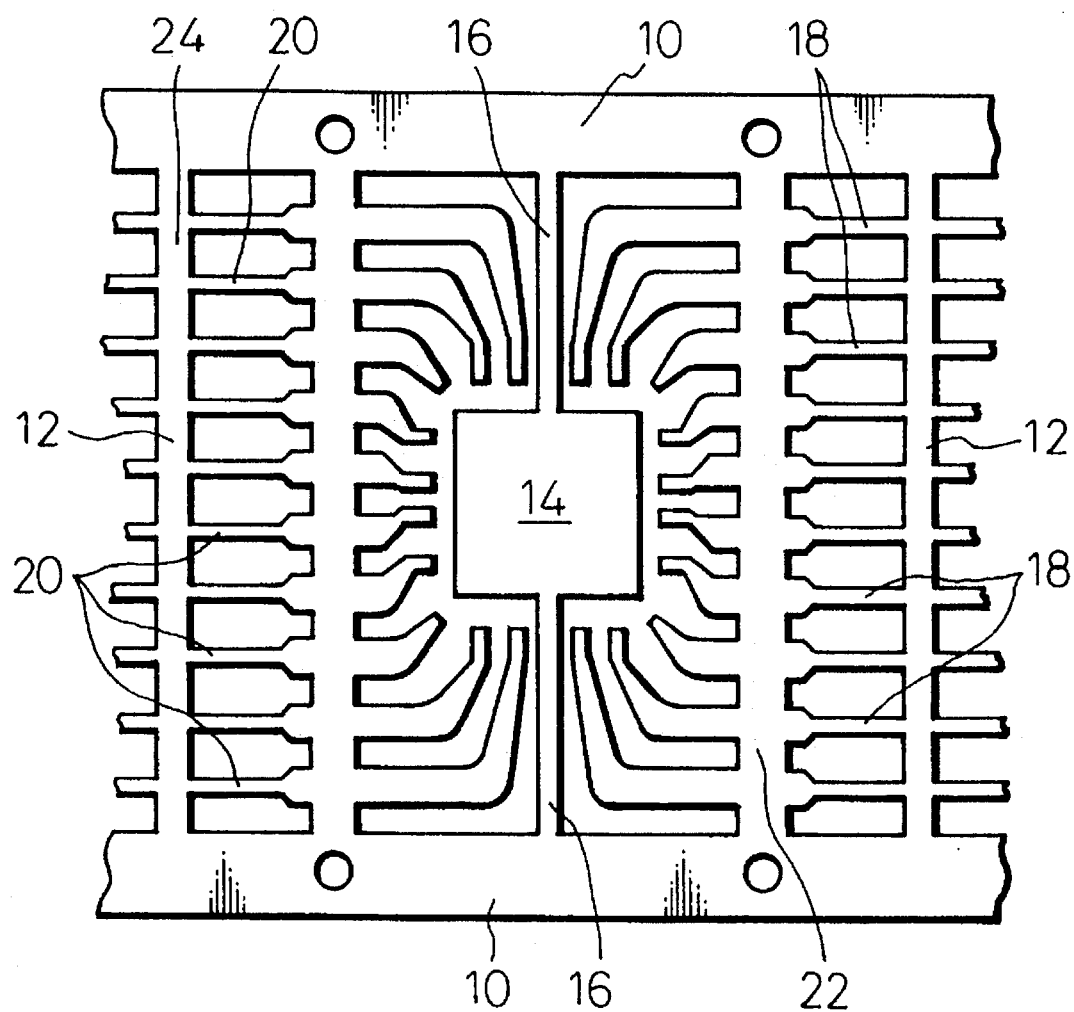
FIG. 1 is a partial plan view of a lead frame used in production of a dual-in-line type of electronic package.

FIG. 1 shows a lead frame as an example of a metal insert which is partially embedded in a molded resin mass. This lead frame is used in production of a dual-in-line type of electronic package, and may be formed from a thin Cu plate, Cu alloy plate, Ni-Fe alloy plate or the like by a mechanical punching process or a photoetching process. The lead frame comprises a pair of side frame portions 10, and a plurality of lateral frame lateral frame portions 12 integrally extended between the side frame portions 10 and spaced from each other. Note, in FIG. 1, only one set of two adjacent lateral frame portions is illustrated. The lead frame also comprises a rectangular central stage 14 arranged at a center of a rectangular area defined by the set of lateral frame portions 12, and the central stage 14 is supported by the side frame portions 10 through the intermediary of two bar elements 16 integrally extended between the side frame portions and opposed sides of the central stage 14, respectively. The lead frame further comprises a first group of lead elements 18 integrally extended from one of the lateral frame portions 12 toward the central stage 14, a second group of lead elements 20 integrally extended from the other lateral frame portions 12 toward the central stage 14, a first dam-bar element 22 transversely extended through the lead elements 18 and integrated with the side frame portions 10 at the ends thereof, and a second dam-bar element 24 transversely extended through the lead elements 20 and integrated with the side frame portions 10 at the ends thereof.

In the production of the dual-in-line type package, an electric element such as an integrated circuit (IC) chip is securely mounted on the central stage 14 of the lead frame by using a silver or gold paste, and then is electrically connected to the inner ends of the lead elements 18, 20 by a well-known wire-bonding process. Thereafter, the central stage 14 with the IC chip is enclosed together with the inner ends of the lead elements 18, 20 by a split mold, and the dam-bar elements 22 and 24 of the lead frame are in cooperation with the split mold to define a closed molding cavity. Then, a suitable curable synthetic resin such as epoxy is introduced into the molding cavity, and thus the IC chip is sealed in the molded resin mass in such a manner that the lead frame is partially embedded therein. After the introduced resin is cured, the split mold is removed from the lead frame, and the dam-bar elements 22, 24 are cut to release the lead elements 18, 20 from the dam-bar connections. Thereafter, the lead elements 18, 20 are trimmed by a press-cutting process such that the lead elements 18, 20 are detached from the lateral frame portions 12, and are bent downwardly with respect to the molded resin mass. As a result, the dual-in-line type package is obtained.

The present invention is directed to a novel method of surface treatment for roughening surfaces of the metal insert or lead frame as mentioned above, and, in this embodiment, the lead frame is treated by the rough-surface treatment method according to the present invention, prior to the mounting of the IC chip on the central stage thereof.

The rough-surface treatment method features two electrolytic-plating processes: a first electrolytic-plating process for producing a substantial quantity of copper nuclei over the surfaces of the lead frame; and a second electrolytic-plating process for growing up the copper nuclei with nickel or nickel alloy to thereby produce a substantial amount of granulations over the surfaces of the lead frame. In this case, the size of the copper nuclei is on the order of sub-microns, and can be obtained by controlling the first electrolytic-plating process such that an average thickness of plating of less than about 1.0 µm (preferably 0.5 µm) is obtained. Also, the size of the granulations is at most 1.0 µm, and can be obtained by controlling the second electrolytic-plating process such that an average thickness of plating is about 0.5 to about 1.5 µm.

The granulations produced over the surfaces of the lead frame contribute to increasing a contact area between the lead frame and the molded resin mass, whereby the lead frame exhibits a remarkably improved adhesion property with respect to the molded resin mass. When the second electrolytic-plating process is controlled such that an average thickness of plating is less than 0.5 µm, the granulations cannot be sufficiently grown up, and thus an improvement in the adhesion property of the lead frame to the molded resin mass is poor. On the contrary, when the second electrolytic-plating process is controlled such that an average thickness of plating is more than 1.5 µm, the number of the granulations is reduced so that a contact area between the lead frame and the molded resin mass becomes smaller, and thus an improvement in the adhesion property is also poor.

When the copper nuclei are grown up as the nickel alloy granulations, the second electrolytic-plating process preferably comprises a Sn-Ni alloy plating process. Nevertheless, the growth of the copper nuclei as the nickel alloy granulations may be carried out by a Co-Ni alloy plating process or a Fe-Co-Ni alloy plating process.

EXAMPLE I

A lead frame was formed from copper, and was subjected to an electrolytic-copper-plating process under the following conditions:

(1) A plating solution composed of a copper cyanide (CuCN) component of about 80 g/l, and a free potassium cyanide (KCN) of about 40 g/l was used.

(2) The plating temperature was 40° C.

Figure 2:
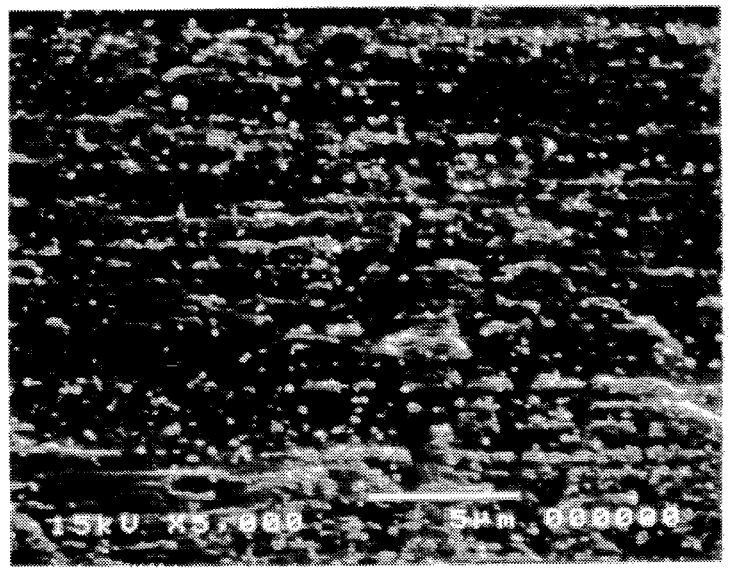
FIG. 2 is an electron microscope photograph showing a lead frame blank which has been treated by an electrolytic-copper-plating process in accordance with the present invention.

(3) The cathode current density was 5 A/dm$^2$. The electrolytic-copper-plating process was controlled such that an average plating thickness of about 0.5 µm could be obtained. The resultant lead frame was observed by an electron microscope and was photographed by an instant camera. This photograph is shown as FIG. 2. As shown in the photograph, a substantial quantity of copper nuclei, which are viewed as small white stains, are produced over the surface of the lead frame. As apparent from the scale shown in the photograph, the size of the copper nuclei is on the order of sub-microns.

Then, the lead frame was further subjected to a Sn-Ni alloy plating process under the following conditions:

(1) A plating solution composed of a stannous chloride (SnCl$_2$) component of about 80 g/l, a nickel chloride (NiCl$_2$) component of about 300 g/l, a sodium fluoride (NaF) component of about 30 g/l, and an ammonium hydrogen fluoride (NH$_3$ HF) component of about 35 g/l was used.

(2) The plating temperature was 75° C.

Figure 3:
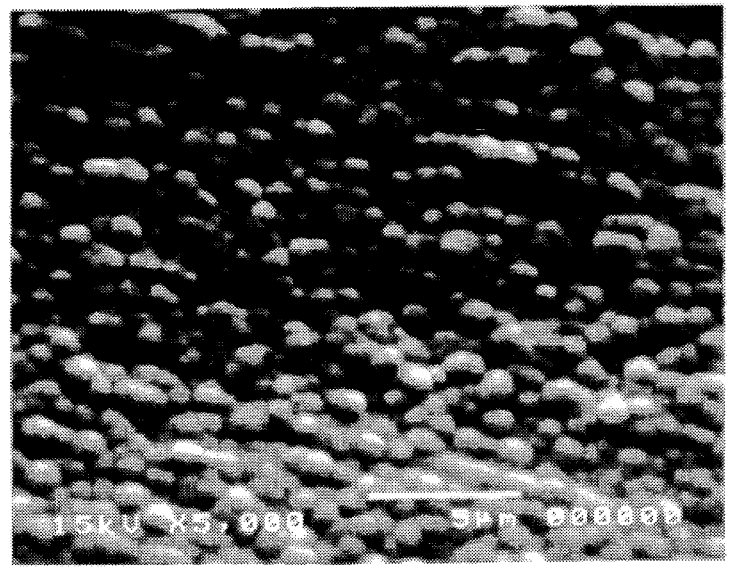
FIG. 3 is an electron microscope photograph showing the lead frame blank which has been further treated by an electrolytic-nickel alloy-plating process in accordance with the present invention.

(3) The cathode current density was 2 A/dm$^2$. The Sn-Ni alloy plating process was controlled such that an average plating thickness of about 0.5 µm could be obtained. The resultant lead frame was also observed by the electron microscope and was photographed by the instant camera. This photograph is shown as FIG. 3. As shown in the photograph, the copper nuclei were grown up as granulations produced over the surface of the lead frame. As apparent from the scale shown in the photograph, the size of the granulations was less than 1.0 µm.

EXAMPLE II

Figure 4:
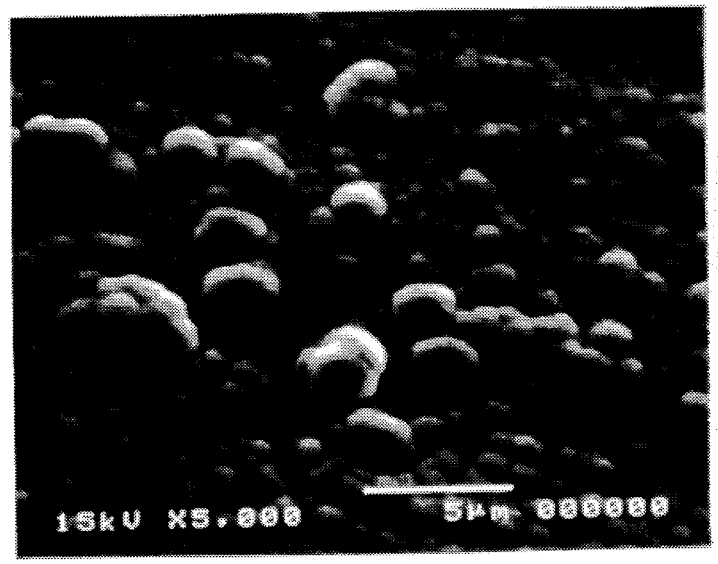
FIG. 4 is an electron microscope photograph similar to the photograph of FIG. 3, showing the lead frame blank which has been further treated by another electrolytic-nickel alloy-plating process in accordance with the present invention.

Similar to Example I, a lead frame was formed from copper, and was subjected to an electrolytic-copper-plating process under the same conditions as Example I. Then, the lead frame was further subjected to a Sn-Ni alloy plating process under the same conditions as Example I except that the Sn-Ni alloy plating process was controlled such that an average plating thickness of about 1.0 µm could be obtained. The resultant lead frame was observed by the electron microscope and was photographed by the instant camera. This photograph is shown as FIG. 4. As shown in the photograph, the copper nuclei were grown up as granulations produced over the surface of the lead frame. As apparent from the scale shown in the photograph, the size of the granulations was at most 1.0 µm.

EXAMPLE III

A lead frame formed from Fe-Ni alloy was prepared. This lead frame was subjected to an electrolytic-copper-plating process under the same conditions as Example I, and was then subjected to a Sn-Ni alloy plating process under the same conditions as Example I. Similar to Example I, the resultant lead frame had a substantial amount of granulations produced over the surface thereof, but the size of the granulartions was somewhat smaller that of the granulations according to Example I.

COMPARATIVE EXAMPLE

Figure 5:
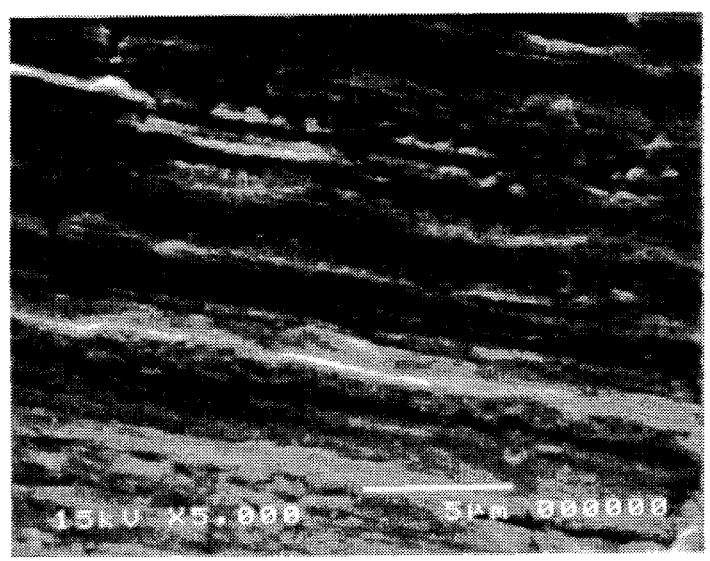
FIG. 5 is an electron microscope photograph showing a lead frame blank which has been directly treated by an electrolytic-nickel alloy-plating process in accordance under the same conditions as those in FIG. 3 without being subjected to an electrolytic-copper-plating process.

A lead frame formed from copper was directly subjected to a Sn-Ni alloy plating process under the same conditions as Example I. The resultant lead frame was observed by the electron microscope and was photographed by the instant camera. This photograph is shown as FIG. 5. As shown in the photograph, the lead frame has no granulations produced over the surface thereof.

Package Crack Evaluation Test

By using the lead frames obtained from Example I, one hundred sample packages were produced. The sample packages were exposed to an ambience having a temperature of 85° C. and an air moisture content of 85% (RH), over a period of 168 hours, and then were placed in an infrared oven having an interior temperature of 235° C., over period of 10 sec. As a result, no cracks occurred in any of the sample packages. The same test was performed on each of the cases of Examples II and III, and no cracks occurred in any of the sample packages. Further, the same test was performed on the Comparative Example, and cracks occurred in seventy-five percent of the sample packages.

In the foregoing description, although the metal insert is represented by the lead frame used in the production of an electronic package, it should be understood that the present invention can be applied to another type of metal insert such as connecting pins of an electrical connector, metal contacts of an electrical switch or the like which are partially embodied in a molded resin mass. Further, the metal insert may be a reinforcement which is fully embedded in a molded resin mass.

Also, although the metal insert or lead frame is formed from copper or Fe-Ni alloy, it may be another metal such as copper alloy, steel or steel alloy.

Finally, it will be understood by those skilled in the art that the foregoing description is of preferred embodiments of the disclosed metal insert, and that various changes and modifications may be made to the present invention without departing from the spirit and scope thereof.

I claim:

1. A metal insert at least partially embedded in a molded resin mass, comprising:

a metal insert blank;

said metal insert blank being treated by an electrolytic-copper-plating process such that a substantial amount of copper nuclei is spread over a surface thereof;

a substantial amount of nickel granulations produced over the surface of said metal insert blank, a size of said granulations being at most 1.0 μm; and said nickel granulations being formed on the copper nuclei by an electrolytic nickel plating process.

2. A metal insert as set forth in claim 1, wherein said electrolytic-copper-plating process is controlled such that an average thickness of plating is from about 0.5 to about 1.0 μm, and wherein said electrolytic-nickel-plating process is controlled such that an average thickness of plating is from about 0.5 to about 1.5 μm.

3. A metal insert as set forth in claim 1, wherein said metal insert blank is formed from a metal material selected from the group consisting of copper, copper alloy, and Fe-Ni alloy.

4. A metal insert at least partially embedded in a molded resin mass, comprising:

a metal insert blank;

said metal insert blank being treated by an electrolytic-copper-plating process such that a substantial quantity of copper nuclei is spread over a surface thereof;

a substantial amount of nickel alloy granulations produced over the surface of said metal insert blank, a size of said granulations being at most 1.0 μm; and said nickel alloy granulations being formed on the copper nuclei by an electrolytic nickel alloy plating process.

5. A metal insert as set forth in claim 4, wherein said electrolytic-copper-plating process is controlled such that an average thickness of plating is from about 0.5 to about 1.0 μm, and wherein said electrolytic-nickel alloy-plating process is controlled such that an average thickness of plating is from about 0.5 to about 1.5 μm.

6. A metal insert as set forth in claim 5, wherein said electrolytic-nickel alloy-plating process comprises an electrolytic-plating process selected from the group consisting of a Sn-Ni alloy plating process, a Co-Ni alloy plating process, and a Fe-Co-Ni alloy plating process.

7. A metal insert as set forth in claim 4, wherein in that said metal insert blank is formed from a metal material selected from the group consisting of copper, copper alloy, and Fe-Ni alloy.

8. A method of rough-surface treatment for a metal insert at least partially embedded in a molded resin mass, comprising the step of:

producing a substantial quantity of copper nuclei over a surface of a metal insert blank by controlling an electrolytic-copper-plating process such that an average thickness of plating is from about 0.5 to about 1.0 μm; and growing up said copper nuclei as nickel granulations by controlling an electrolytic-nickel-plating process such that an average thickness of plating is from about 0.5 to about 1.5 μm.

9. A metal insert as set forth in claim 8, wherein said metal insert blank is formed from a metal material selected from the group consisting of copper, copper alloy, and Fe-Ni alloy.

10. A method of rough-surface treatment for a metal insert at least partially embedded in a molded resin mass, comprising the step of:

producing a substantial quantity of copper nuclei over a surface of a metal insert blank by controlling an electrolytic-copper-plating process such that an average thickness of plating is from about 0.5 to about 1.0 μm; and forming nickel granulations upon said copper nuclei by controlling an electrolytic-nickel alloy-plating process such that an average thickness of plating is from about 0.5 to about 1.5 μm.

11. A metal insert as set forth in claim 10, wherein said metal insert blank is formed from a metal material selected from the group consisting of copper, copper alloy, and Fe-Ni alloy.

12. A metal insert as set forth in claim 11, wherein said electrolytic-nickel alloy-plating process comprises an electrolytic-plating process selected from the group consisting of a Sn-Ni alloy plating process, a Co-Ni alloy plating process, and a Fe-Co-Ni alloy plating process.

* * * * *